(12) United States Patent
Yang et al.

(10) Patent No.: US 6,377,067 B1
(45) Date of Patent: Apr. 23, 2002

(54) TESTING METHOD FOR BURIED STRAP AND DEEP TRENCH LEAKAGE CURRENT

(75) Inventors: Shih-Hsien Yang; Chuan-Jane Chao, both of Hsinchu (TW)

(73) Assignee: Winbond Electronics Corporation, Taiwan (CN)

( * ) Notice: Subject to any disclaimer, the term of this patent is extended or adjusted under 35 U.S.C. 154(b) by 0 days.

(21) Appl. No.: 09/495,753

(22) Filed: Feb. 1, 2000

(51) Int. Cl.[7] ............................................. G01R 31/26
(52) U.S. Cl. ........................ 324/769; 324/765; 438/14
(58) Field of Search ................................. 324/765, 754, 324/769; 438/254, 246; 257/298, 301, 302; 365/149, 194

(56) References Cited

U.S. PATENT DOCUMENTS 5,893,735 A * 4/1999 Stengl et al. ............... 438/243
6,185,125 B1 * 2/2001 Yang ........................... 365/149

OTHER PUBLICATIONS

Bronner, "DRAM Technology Trends for 256Mb and Beyond," IEDMS'96, pp. A2–2–pp.75–82.

* cited by examiner

*Primary Examiner*—Safet Metjahic
*Assistant Examiner*—Parreh Patel
(74) *Attorney, Agent, or Firm*—Finnegan Henderson Farabow Garrett & Dunner LLP

(57) ABSTRACT

A method for measuring both buried strap and deep trench leakage currents in DRAM cell capacitors. By keeping the voltages on both plates of the capacitor equal, the buried strap leakage current (IBS) may be isolated and measured. A range of voltages is applied to a terminal of an associated transistor to obtain a corresponding range of buried strap leakage currents. An unequal voltage is next applied across the capacitor, and a total leakage current is measured. By applying a known potential to a substrate of the transistor during this total leakage current measurement, the associated IBS may be determined. Next, the IBS is subtracted from the measured total leakage current to obtain the deep trench leakage current (IDT).

21 Claims, 5 Drawing Sheets

IBS (VSUB=-0.5V)

(X-AXIS = VSN / Y-AXIS = CURRENT)(VBP=1V)

TESTING METHOD FOR BURIED STRAP AND DEEP TRENCH LEAKAGE CURRENT

BACKGROUND OF THE INVENTION

Field of the Invention

The present invention relates generally to measuring leakage current from capacitors in integrated circuits, and more particularly, to the measurement of different types of leakage current from deep trench capacitors in dynamic random access memory (DRAM) cells.

The accurate measurement of DRAM cell capacitor leakage is an important technique for evaluating the retention time of the DRAM cells. This measurement becomes increasingly important with the scaling of memory technology by the reduction of storage capacitance and stored charge.

In a deep-trench capacitor structure (e.g, in FIG. 3), there are two major components of leakage current. One component is the buried strap leakage current (IBS) which is dominated by the pn junction leakage. The other component is the nitride-oxide (NO) film leakage current, sometimes referred to as the deep trench leakage current, (IDT) which is dominated by Frenkel-Poole emission. Conventionally, it is difficult to distinguish between these two leakage currents, IBS and IDT.

Very small resistances, and thus leakage currents, can be measured by the circuit arrangement shown in FIG. 1. This arrangement is for measuring resistance in a simple three terminal device having internal resistances R1, R2, and R3. For example, as in FIG. 1, R2 is connected to ground, R3 is connected to a virtual ground at differential amplifier 10, and a known input voltage VIN is applied to R1. The voltage output by the differential amplifier 10 can be used to calculate R1, R2, and R3. However, this simple resistance measurement technique is only of use when the three terminal device has a similarly simple resistance structure as shown in FIG. 1.

However, the DRAM structure of interest, shown schematically in FIG. 2, includes a deep trench resistance 40 (RDT), a large substrate resistance 50 (Rsub), and a buried plate resistance 30 (Rbp). Further, as FIG. 2 shows, the storage node (SN), substrate (SUB), and buried plate (BP) measurement points are common to many DRAM cells, resulting in a very complex resistance structure. Therefore, a conventional current measurement useful with the simple R1, R2, and R3 resistance structure shown in FIG. 1 is not appropriate for the complex resistance structure shown in FIG. 2. In the conventional 3-terminal measurement, the current flow ($I_{13}$) from the node 1 to node 3 through the resistor $R_1$ and $R_3$ will be measured from the node 3. The current flow ($I_{23}$) from the node 2 to node 3 will be equal to zero induced be the true ground (node 2) and virtual ground (node 3). Then we can get the current flow of node to node for the 3-terminal structure.

But in the DRAM cell with deep trench capacitor structure, the substrate resistance and buried plate resistance are the distributed resistance. The 3-terminal structure of storage node, substrate and buried plate is not a simple $R_1$, $R_2$, and $R_3$ structure any more. If we set the true ground node at the buried plate (BP) and virtual ground node at substrate (SUB), the current measured from the SUB node will include the $I_{SN-SUB}$ through the substrate resistor ($R_{sub}$) and the ($I_{DT-BP-SUB}$) through the trench capacitor resistor (Rdt) and buried plate resistor (Rbp). That is not what we want. Also, the large areas of the substrate and buried plate induce a noise effect which further complicates this resistance measurement. Thus, the simple resistance measurement method outlined above is not suitable for DRAM cell leakage measurement.

The buried strap leakage current is dominated by the pn junction current dependent upon temperature, and the NO film leakage current is also dependent on temperature. Thus, the two leakage currents are unable to be decoupled by temperature.

When such deep trench capacitors are scaled to a smaller size, their capacitance must be increased by reducing the thickness of the NO film. In such an event, the NO film leakage can increase to be comparable in magnitude with the buried strap leakage current. It is useful for DRAM circuit designers to know how the NO film leakage current has increased due to their designs.

A method of accurately determining both the buried strap and the NO film leakage current during wafer testing enable the estimation of DRAM cell behavior before product testing begins. Because leakage current is an important design characteristic of DRAM cells, it is very important to know accurately where the leakage occurs, either through buried strap leakage or NO film leakage.

SUMMARY OF THE INVENTION

The objects of the invention are to measure different leakage currents from the same node under different biasing conditions, thereby reducing a noise effect induced by the large substrate and buried plate. A new testing procedure is provided, used in, for example, wide area testing (WAT), during integrated circuit manufacturing to measure buried strap and deep trench capacitor leakage currents.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, an embodiment of the invention includes a method for measuring buried strap leakage current in a capacitor having one plate electrically connected to a source terminal of a transistor and having a buried plate, the transistor further having a gate terminal and a substrate terminal, the method comprising: applying a biasing voltage to the substrate terminal of the transistor; applying a sweep voltage to the source terminal of the transistor and to the buried plate of the capacitor; and measuring the buried strap leakage current at the source terminal of the transistor.

Another embodiment of the invention includes a method for measuring deep trench leakage current in a capacitor having one plate electrically connected to a source terminal of a transistor and having a buried plate, the transistor further having a gate terminal and a substrate terminal, the method comprising: obtaining a buried strap leakage current value for the capacitor corresponding to a diode voltage between the source terminal and the substrate terminal; applying a biasing voltage to the buried plate of the capacitor; applying a first sweep voltage to the substrate terminal of the transistor; applying a second sweep voltage to the source terminal of the transistor equal to a sum of the first sweep voltage and the diode voltage; measuring a current at the source terminal of the transistor; and subtracting the buried strap leakage current value from the measured current to obtain the deep trench leakage current.

Still another embodiment of the invention includes a method for measuring deep trench leakage current in a capacitor having one plate electrically connected to a source terminal of a transistor and having a buried plate, the transistor further having a gate terminal and a substrate terminal, the method comprising: obtaining a buried strap leakage current for the capacitor; applying a biasing voltage to the buried plate of the capacitor; applying a diode voltage to the substrate terminal of the transistor; applying a sweep voltage to the source terminal of the transistor; measuring a current at the source terminal of the transistor; and subtracting the buried strap leakage current from the measured current to obtain the deep trench leakage current.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE INVENTION

Reference will now be made in detail to the present preferred embodiment of the invention, an example of which is illustrated in the accompanying drawings. Wherever possible, the same reference numbers will be used throughout the drawings to refer to the same or like parts.

Figure 1:
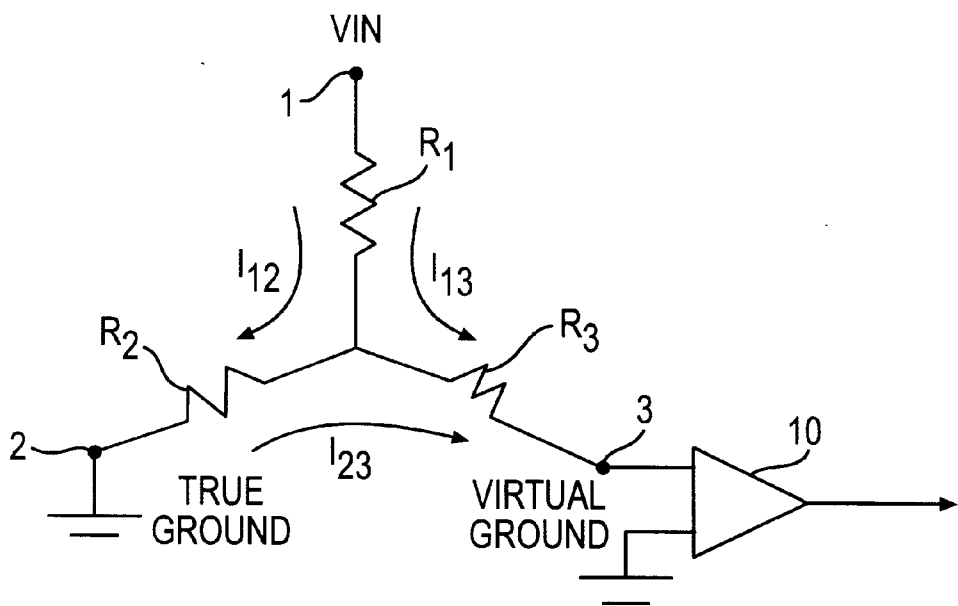
FIG. 1 shows a general schematic for conventional three terminal current measurement.
Figure 2:
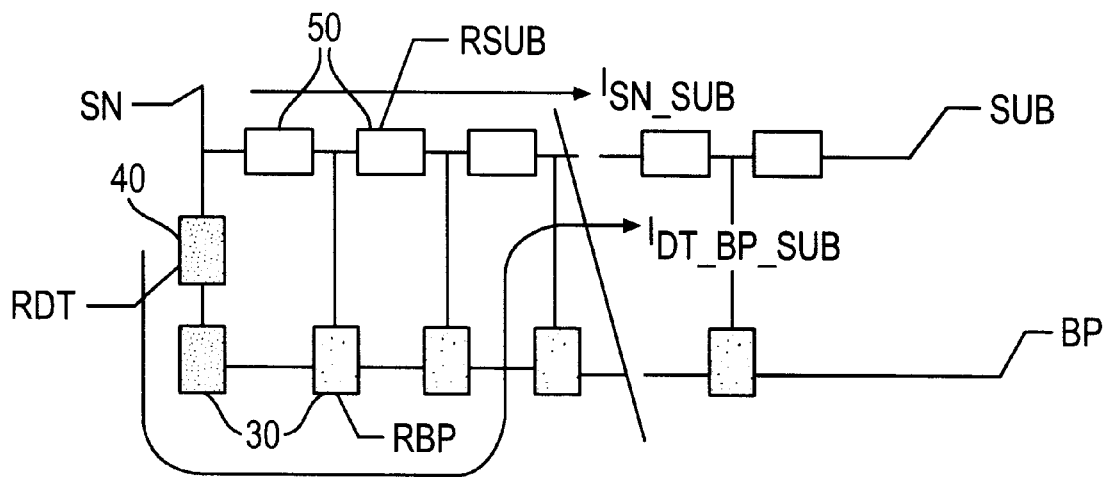
FIG. 2 shows a complex resistance structure for certain kinds of DRAM integrated circuits.
Figure 3:
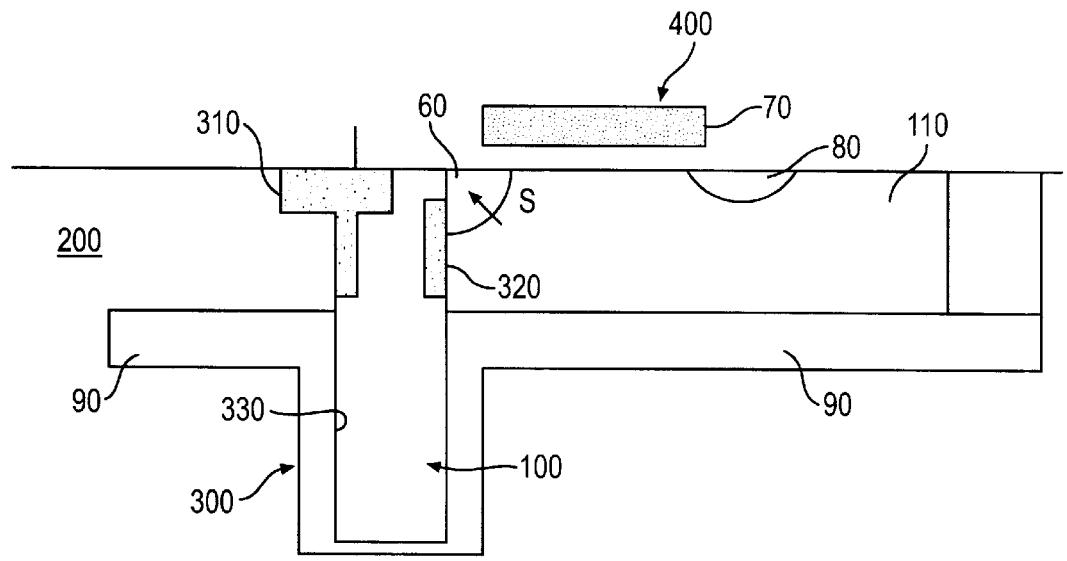
FIG. 3 shows a deep trench DRAM cell structure.

FIG. 3 shows an exemplary DRAM cell 200 in reference to which the present invention will be described. This cell 200 includes a deep trench capacitor 300 connected to a transistor 400 at node 60. Cell 200 also includes a shallow trench insulator (STI) 310 and a buried strap 320. The transistor includes gate 70, source 60, drain 80, and substrate 110. Of course, transistor 400 could also be constructed so that node 60 was the drain of the transistor, instead of the source. Hereinafter, for the sake of convenience, this node 60 will be referred to as the source node. The capacitor 300 comprises doped polysilicon or polyfill 100, NO film 330, and N+ buried plate 90. The polyfill 100 and the N+ buried plate 90 are equivalent to the two electrodes of capacitor 300. Although, the second capacitor electrode should not be construed as limited to buried plate 90, as this electrode may also include, for example, doped substrate material adjacent to the buried plate 90. The NO film 330 located between polyfill 100 and buried plate 90 acts as the capacitor's dielectric material. The STI 310 is used for insulating the cell 200 from an adjacent cell (not shown). The buried strap 320 is used for electrically connecting the source 60 and polyfill 100 to form a single electrical node. Techniques for constructing such a DRAM cell structure 200 are known to those in the semiconductor fabrication art, and are not essential to the scope of the invention. A method for constructing the cell 200 shown in FIG. 3 is disclosed in the published article "DRAM Technology Trends for 256 Mb and Beyond," by Gary Bronner, IEDMS '96, A2-2-.75–82, which is incorporated herein by reference.

The method of measuring current described below is essentially a three terminal measurement, involving the source node 60, the buried plate 90, and the substrate 110. The gate 70 has a voltage of 0V applied to it during all measurements, ensuring that the channel between the source and drain does not conduct. The drain 80 is not relevant to these measurements, and will not be discussed further.

Figure 4:
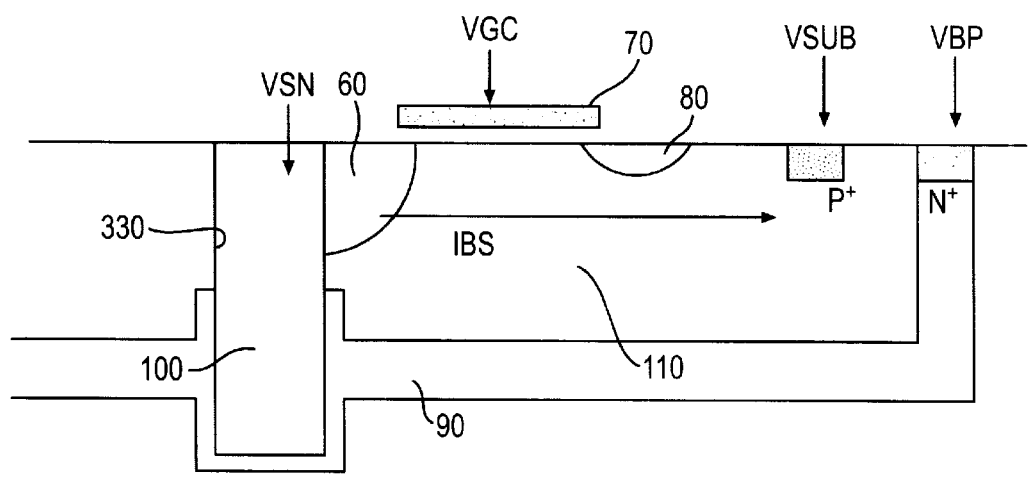
FIG. 4 illustrates measurement of buried strap leakage current (IBS) in a DRAM cell.

Measurement A:

FIG. 4 illustrates a method of measuring the buried strap leakage current IBS alone. In this measurement, the gate 70 is biased at a gate voltage VGC of 0V. The substrate 110 is biased at a substrate voltage VSUB of −Vsub volts. Vsub is a voltage that remains constant throughout the test, and, as an example, was −0.5V when the data shown in FIG. 7 was taken. During IBS measurement, the current IBS is preferably measured over a range of cell operating voltages. For instance, the storage node voltage VSN is typically swept from 0 to Vsn volts, where Vsn is an upper storage node voltage value. At the same time, the buried plate voltage VBP is swept from 0 to Vbp volts, where Vbp is an upper buried plate voltage value. In making the measurement practicing the invention the storage node voltage Vsn is swept from 0 to 2 volts, while the substrate node voltage Vsub can have a test value of from −0.5 to −3.5 volts, and the buried plate node voltage Vbp in this Measurement A example is equal to Vsn, and in the examples of Measurements B and C, Vpb is swept from 0 to 2 volts.

In order to ensure that only IBS is measured during this sweeping of voltages, VSN must equal VBP during the voltage sweep. Because the voltages on both plates of the capacitor (VSN and VBP) are equal and hence produce no potential difference, there will be no deep trench leakage current (IDT). Under the above conditions, the current ISN may be measured at the storage node 60, and will equal the buried strap current IBS. Specific techniques for measuring small currents such as ISN are known to those skilled in the integrated circuit testing art, and will not be further elaborated upon.

Figure 7:
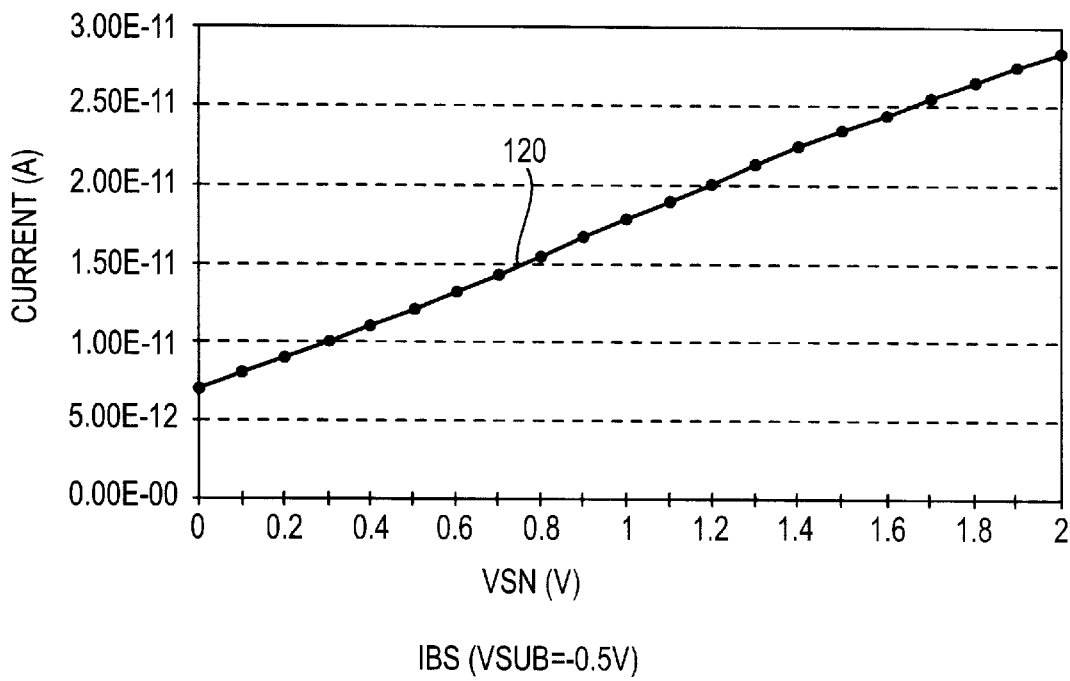
FIGS. 7–10 are plots of various leakage currents versus voltage applied resulting from the measurements in FIGS. 4–6.

Plot 120 in FIG. 7 shows IBS data taken under the above measurement conditions. A large number of cells, about 4000, were tested at the same time. The number of cells to be tested at the same time depends on the amount of leakage current per cell and the geometry of the DRAM integrated circuit. For example, a block of 4096, 8192, etc. cells may also be used. In FIG. 7, the source node voltage VSN was swept from 0V to 2V, and the total IBS for the 4000 cells varies roughly linearly as shown from about 7 to 27 picoamperes.

Figure 5:
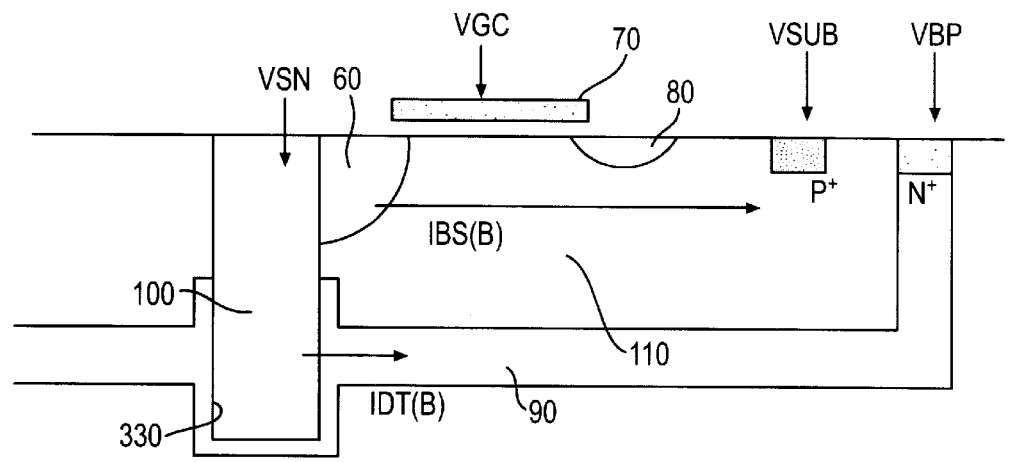
FIG. 5 illustrates one way to measure deep trench leakage current (IDT) in a DRAM cell.

Measurement B:

FIG. 5 illustrates a method of obtaining the deep trench leakage current by measuring the total leakage current and subtracting a buried strap leakage current (IBS) value measured in Measurement A. In this measurement, the gate 70 is also biased at a gate voltage VGC of 0V. The buried plate 90 is biased at a buried plate voltage VBP of Vbp volts. Vbp is a voltage that remains constant throughout the measurement, and, as an example, was 1.0V when the data shown in FIG. 8 was taken. During this measurement, the total leakage current ISN(B) is preferably measured at the storage node 60 over a range of cell operating voltages. For instance, the storage node voltage VSN is typically swept from 0 to Vsn volts, where Vsn is an upper storage node voltage value. At the same time, the substrate voltage VSUB is swept from −Vsub1 to −Vsub2 volts, where −Vsub1 and Vsub2 are lower and upper substrate voltage values, respectively.

In this measurement, during this sweeping of voltages, the voltage difference between VSN and VSUB should be kept at a constant diode voltage xV during the voltage sweep. Because of the constant voltage difference xV between the storage node 60 and substrate 110, the buried strap leakage current IBS(B) should remain constant throughout the voltage sweep. This constant IBS(B) at a potential difference xV may be obtained from the data taken in Measurement A shown in FIG. 7. Under the above conditions, the current ISN(B) may be measured at the source node 60, and subtracting the constant IBS(B) value will yield the deep trench current IDT(B).

Figure 8:
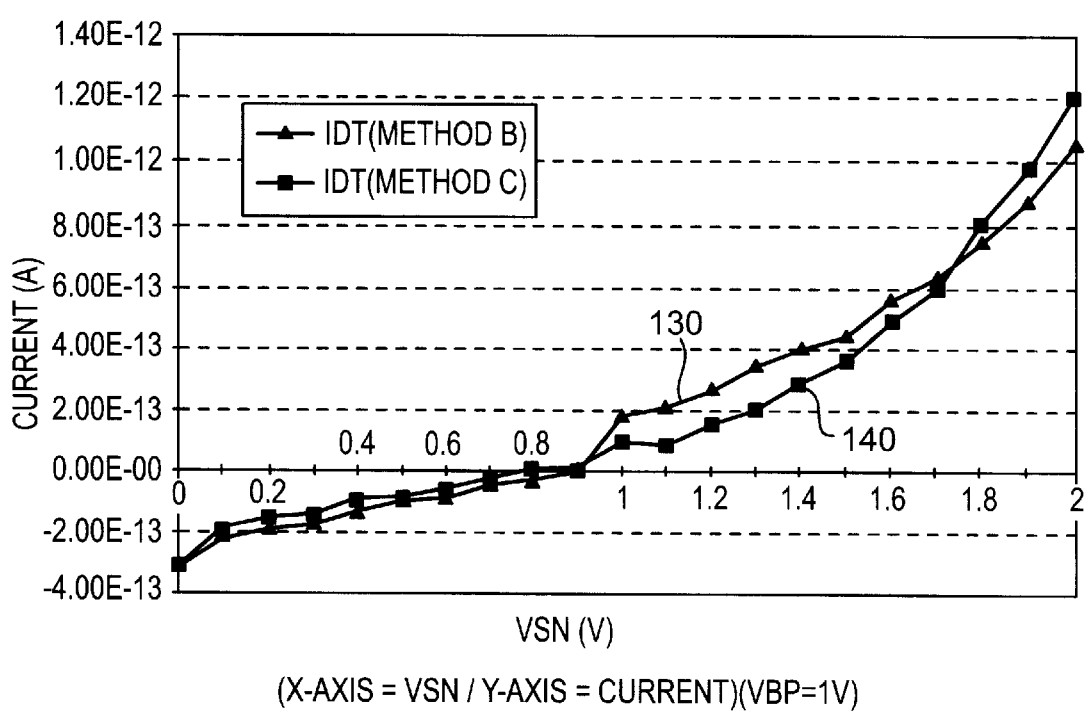

Plot 130 in FIG. 8 shows IDT(B) data taken under the above measurement conditions. In FIG. 8, the source node voltage VSN was swept from 0V to 2V, and VBP was kept at a constant value of 1.0V. IDT(B) varies as shown from about −0.3 to 1.05 picoamperes over this range of VSN voltages. Not surprisingly, the deep trench current IDT(B) is initially negative, due to the fact that VBP=1V, and VSN=0V at first. As VSN increases, IDT(B) becomes positive when VSN becomes greater than VBP, crossing the 0 axis when the two voltages are about equal (~0.9V).

Figure 6:
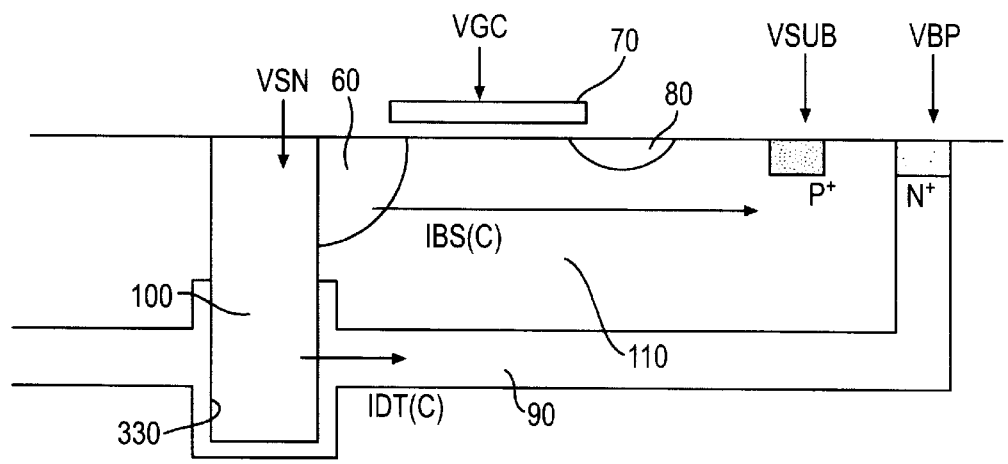
FIG. 6 illustrates another way to measure deep trench leakage current (IDT) in a DRAM cell.

Measurement C:

FIG. 6 illustrates a method of obtaining the deep trench leakage current by measuring the total leakage current and subtracting the buried strap leakage current (IBS) values measured in Measurement A. In this measurement, the gate 70 is also biased at a gate voltage VGC of 0V. The buried plate 90 is biased at a buried plate voltage VBP of Vbp volts. Vbp is a voltage that remains constant throughout the measurement, and, as an example, was 1.0V when the data shown in FIG. 8 was taken. During this measurement, the total leakage current ISN(C) is preferably measured at the source node 60 over a range of cell operating voltages. For instance, the source node voltage VSN is typically swept from 0 to Vsn volts, where Vsn is an upper source node voltage value. However, during this measurement, the substrate voltage VSUB is kept at a constant −Vsub volts, where −Vsub is a diode voltage drop equal to the −0.5V as in Measurement A, and can have a value within a range of −0.5 to −3.5 volts.

Unlike Measurement B in this measurement, during this sweeping of voltages, the voltage difference between VSN and VSUB starts at a diode voltage Vsub, but increases with VSN during the voltage sweep. Hence, the voltage difference between the storage node 60 and substrate 110, increases from xV to (Vsn+Vsub) throughout the voltage sweep. Thus, the IBS(C) values which must be subtracted from ISN(C) would also be expected to vary, but may still be obtained from the data taken in Measurement A shown in FIG. 7. Under the above conditions, the current ISN(C) may be measured at the source node 60, and subtracting the IBS values corresponding to the potential differences between the source node 60 and the substrata 110 will yield the deep trench current IDT(C).

Plot 140 in FIG. 8 shows IDT(C) data taken under the above measurement conditions. In FIG. 8, the source node voltage VSN was swept from 0V to 2V, and VBP was kept at a constant value of 1.0V. IDT(C) appears to vary from −0.3 to 1.2 picoamperes over this range of VSN voltages. IDT(C) is initially negative, and then becomes positive, for the reasons given above with respect to IDT(B).

Measurement B and Measurement C yield two deep trench currents IDT(B) and IDT(C), respectively. The difference in these two measurement procedures is that in B, a constant source-to-substrate voltage is maintained, whereas in C this voltage increases with VSN. If most of the deep trench leakage current occurs within one diode voltage drop, one would expect that IDT(B) and IDT(C) would be substantially equal over the VSN measurement range. However, if the deep trench leakage current continues to increase beyond a diode drop, one would expect the IDT(B) and IDT(C) plots to diverge beyond a certain point, as happens in FIG. 8. Accordingly, either or both measurement methods may be used to measure the deep trench leakage current IDT, depending on whether a second measurement is desired to confirm the accuracy of the first IDT measurement.

Figure 9:
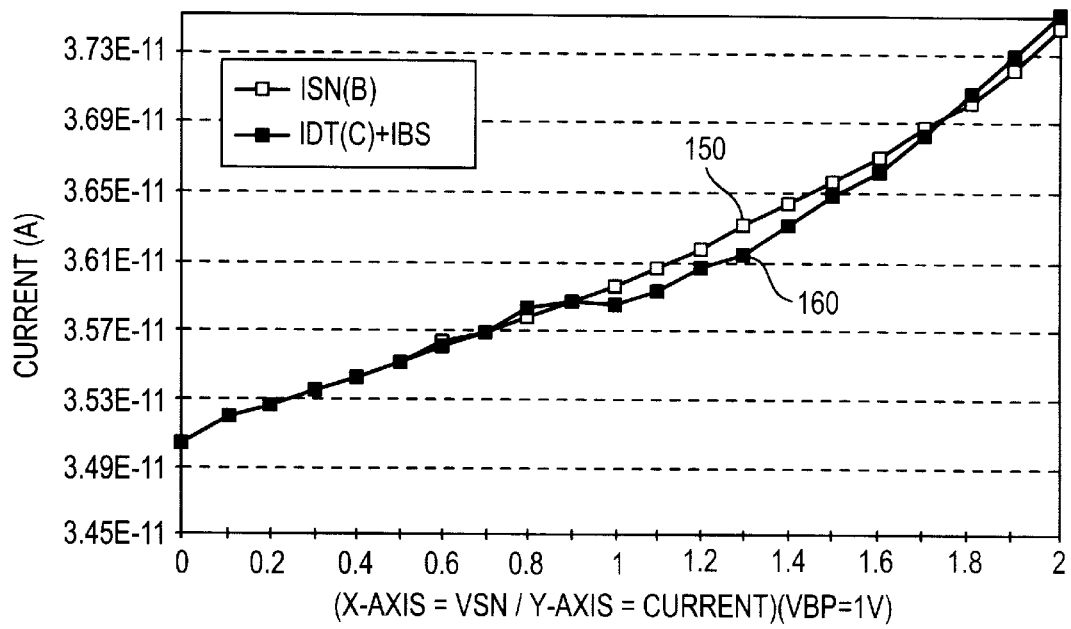

FIG. 9 shows one such confirmation plot of data. Plot 150 is the source node current of Measurement B ISN(B), and plot 160 is the sum of the deep trench current of Measurement C and the buried strap current of Measurement A, IDT(C)+IBS(B). Because ISN(B) is the sum of IDT(B) and the constant buried strap current IBS(B) at one diode drop, xV, it is expected that the two plots 150 and 160 will exhibit similar behavior to the two plots of IDT, 130 and 140, shown in FIG. 8. The difference in the two plots 150 and 160 may be attributed to the difference in measurement methods (i.e., constant IBS in measurement B versus varying IBS in measurement C).

Figure 10:
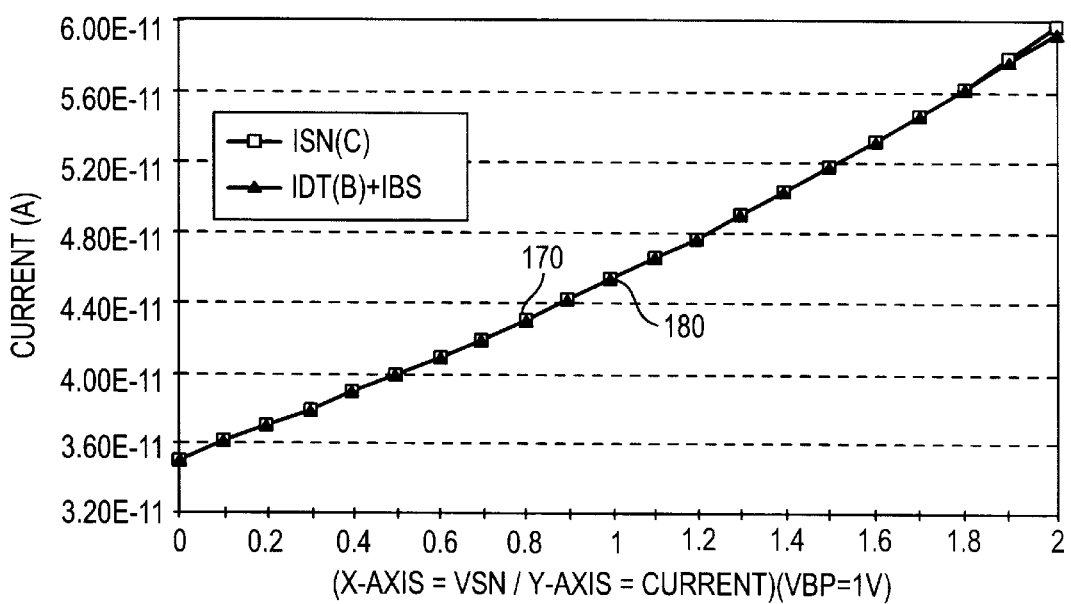

FIG. 10 shows another confirmation plot of data. Plot 170 is the source node current of Measurement C, ISN(C), and plot 180 is the sum of the deep trench current of Measurement B and the buried strap current of Measurement A, IDT(B)+IBS(C). Any difference in IDT(B) from IDT(C) in FIG. 8 seems to have been caused by the constant IBS used to calculate IDT(B), because when IDT(B) is added with IBS from FIG. 7, the total leakage current matches exactly with ISN(C). In other words, FIG. 10 appears to confirm that the difference between the IDT plots 130 and 140 in FIG. 7 is attributable to the difference in measurement methods discussed above. That the two plots in FIG. 10 align also indicates that such leakage current measurements have good repeatability. The difference in plot 170 values of ISN(C) measured in FIG. 10, from the plot 160 value of IDT(C)+IBS as measured in FIG. 9 is had from the differences in Measurement methods B and C, with method B used in arriving at the FIG. 9 values and method C used in arriving at the FIG. 10 values. These different methods B and C result in IBS(B) not being equal to IBS(C).

It will be apparent to those skilled in the art that various modifications and variations can be made in the method of the present invention without departing from the scope or spirit of the invention. As an example, though this method is discussed in the context of a DRAM IC, it is applicable to any integrated circuit having three terminals, and having buried strap and deep trench leakage currents. Further, though the present invention has been discussed in the context of wafer testing, it would also be applied to testing at any point in the manufacturing process, up to and including a packaged device. Other DRAM cell structures than the structure described in this disclosure have the same problem in measuring the leakage current in fabricated cell structures. In such other DRAM cell structures having the same components an upper and lower plate and a diffusion connection from the transistor to the capacitor the method of the present invention can be used to measure the leakage current.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for measuring buried strap leakage current in a DRAM cell having a deep trench storage capacitor and a transistor, where the buried strap is a conductor between one plate of the capacitor and a terminal of the transistor, the transistor further having a gate and a substrate, and the capacitor further having a buried plate, the method comprising:

applying a biasing voltage to the substrate of the transistor;

applying a sweep voltage to the terminal of the transistor and to the buried plate of the capacitor; and measuring the buried strap leakage current at the terminal of the transistor.

2. The method of claim 1, further comprising:

applying another biasing voltage to the gate of the transistor.

3. The method of claim 2, wherein the another biasing voltage applied to the gate of the transistor is 0V.

4. The method of claim 1, further comprising:

changing the sweep voltage over a range of voltage values, wherein the measuring occurs at periodic points within the range of voltage values.

5. The method of claim 4, wherein the biasing voltage applied to the substrate of the transistor is less than 0V, and the range of voltage values includes from 0V to 2V.

6. The method of claim 1, wherein the capacitor and transistor comprise a cell in an integrated circuit, and the measuring step measures a total current in a plurality of cells whose respective transistor terminals, substrates, and buried plates are electrically connected.

7. A method for measuring deep trench leakage current in a DRAM cell having a deep trench storage capacitor and a transistor, where a buried strap conducts between one plate of the capacitor and a terminal of the transistor, the transistor further having a gate and a substrate, and the capacitor further having a buried plate, the method comprising:

obtaining a buried strap leakage current value for the capacitor corresponding to a diode voltage between the terminal of the transistor and the substrate;

applying a biasing voltage to the buried plate of the capacitor;

applying a first sweep voltage to the substrate of the transistor;

applying a second sweep voltage to the terminal of the transistor equal to a sum of the first sweep voltage and the diode voltage;

measuring a current at the terminal of the transistor; and subtracting the buried strap leakage current value from the measured current to obtain the deep trench leakage current.

8. The method of claim 7, further comprising:

applying another biasing voltage to the gate of the transistor.

9. The method of claim 8, wherein the another biasing voltage applied to the gate of the transistor is 0V.

10. The method of claim 7, further comprising:

changing the first sweep voltage over a range of voltage values; and changing the second sweep voltage over a second range of voltage values, wherein the measuring occurs at periodic points within the second range of voltage values.

11. The method of claim 10, wherein the biasing voltage applied to the buried plate of the capacitor is greater than 0V, and the second range of voltage values includes from 0V to 2V.

12. The method of claim 7, wherein the capacitor and transistor comprise a cell in an integrated circuit, and the measuring step measures a total current in a plurality of cells whose respective transistor terminals, substrates, and buried plates are electrically connected.

13. A method for measuring deep trench leakage current in a DRAM cell having a deep trench storage capacitor and a transistor, where a buried strap conducts between one plate of the capacitor and a terminal of the transistor, the transistor further having a gate and a substrate, and the capacitor further having a buried plate, the method comprising:

obtaining a buried strap leakage current value for the capacitor;

applying a biasing voltage to the buried plate of the capacitor;

applying a diode voltage to the substrate of the transistor;

applying a sweep voltage to the terminal of the transistor;

measuring a current at the terminal of the transistor; and subtracting the buried strap leakage current from the measured current to obtain the deep trench leakage current.

14. The method of claim 13, further comprising:

applying another biasing voltage to the gate of the transistor.

15. The method of claim 14, wherein the another biasing voltage applied to the gate of the transistor is 0V.

16. The method of claim 13, further comprising:

changing the sweep voltage over a range of voltage values, wherein the measuring occurs at periodic points within the range of voltage values.

17. The method of claim 16, wherein the biasing voltage applied to the buried plate of the capacitor is greater than 0V, the diode voltage applied to the substrate of the transistor is less than 0V, and the range of voltage values includes from 0V to 2V.

18. The method of claim 13, wherein the capacitor and transistor comprise a cell in an integrated circuit, and the measuring step measures a total current in a plurality of cells whose respective transistor terminals, substrates, and buried plates are electrically connected.

19. A method for measuring leakage current in a deep trench DRAM cell having a capacitor electrically connected to a terminal of a transistor, the transistor further having a substrate terminal, and the capacitor further having a buried plate, the method comprising:

measuring a buried strap leakage current by:

applying a biasing voltage to the substrate of the transistor, applying a sweep voltage to the terminal of the transistor and to the buried plate of the capacitor, and measuring a current at the terminal of the transistor; and measuring a deep trench leakage current by:

applying another biasing voltage to the buried plate of the capacitor, applying a predetermined voltage to the substrate of the transistor, applying another sweep voltage to the terminal of the transistor, measuring a total current at the terminal of the transistor, and subtracting the buried strap leakage current from the measured total current to obtain the deep trench leakage current.

20. The method of claim 19, wherein the predetermined voltage is a diode voltage.

21. The method of claim 19, wherein the predetermined-voltage is a sum of the another sweep voltage and a diode voltage.

* * * * *

UNITED STATES PATENT AND TRADEMARK OFFICE
CERTIFICATE OF CORRECTION

PATENT NO.   : 6,377,067 B1
DATED        : April 23, 2002
INVENTOR(S)  : Shih-Hsien Yang et al.

It is certified that error appears in the above-identified patent and that said Letters Patent is hereby corrected as shown below:

<u>Title page,</u>
Item [73], delete "(CN)"

Signed and Sealed this

Tenth Day of December, 2002

JAMES E. ROGAN
*Director of the United States Patent and Trademark Office*